(12) United States Patent
Streppel

(10) Patent No.: US 10,663,141 B2
(45) Date of Patent: May 26, 2020

(54) DEVICE THAT ILLUMINATES A DEFINED SURFACE

(71) Applicant: OSRAM Opto Semiconductors GmbH, Regensburg (DE)

(72) Inventor: Ulrich Streppel, Regensburg (DE)

(73) Assignee: OSRAM OLED GmbH, Regensburg (DE)

(*) Notice: Subject to any disclaimer, the term of this patent is extended or adjusted under 35 U.S.C. 154(b) by 0 days.

(21) Appl. No.: 16/347,952

(22) PCT Filed: Nov. 29, 2017

(86) PCT No.: PCT/EP2017/080764
§ 371 (c)(1),
(2) Date: May 7, 2019

(87) PCT Pub. No.: WO2018/099944
PCT Pub. Date: Jun. 7, 2018

(65) Prior Publication Data
US 2019/0277478 A1    Sep. 12, 2019

(30) Foreign Application Priority Data

Nov. 29, 2016 (DE) .......................... 10 2016 123 002

(51) Int. Cl.
*F21V 5/04* (2006.01)
*G02B 3/08* (2006.01)
(Continued)

(52) U.S. Cl.
CPC ................ *F21V 5/045* (2013.01); *G02B 3/08* (2013.01); *G02B 19/0052* (2013.01); *G02B 19/0061* (2013.01); *H01L 33/58* (2013.01)

(58) Field of Classification Search
CPC .. G02B 3/08; G02B 19/0052; G02B 19/0061; F21V 5/045
See application file for complete search history.

(56) References Cited

U.S. PATENT DOCUMENTS

2005/0190564 A1* 9/2005 Amano ................... F21V 5/045
                                                                     362/336
2011/0007505 A1    1/2011 Wang
(Continued)

FOREIGN PATENT DOCUMENTS

| CN | 101988680 A | 3/2011 |
|---|---|---|
| DE | 10 2014 112 891 A1 | 3/2016 |
| WO | 2016/062927 A1 | 4/2016 |

OTHER PUBLICATIONS

Wen-Gong Chen et al., "Better reading light system with light-emitting diodes using optimized Fresnel lens," Optical Engineering, vol. 45, No. 6, Jun. 2006, pp. 063001-1-063001-7.

*Primary Examiner* — Mariceli Santiago
(74) *Attorney, Agent, or Firm* — DLA Piper LLP (US)

(57) ABSTRACT

An illumination device includes a radiation-emitting opto-electronic component and Fresnel optics including a Fresnel structure having annular ridges and annular grooves, wherein the ridges are configured as closed rings, the ridges and the grooves enclose an optical midaxis of the Fresnel structure, at least one first section of a ridge has a different shape in a predetermined angle range in relation to the midaxis than a second section of the ridge in a second angle range, and the ridges of the Fresnel structure include an inner face and an outer face in cross section through a plane of the midaxis, the inner face facing toward the midaxis in the radial direction, the outer face facing away from the midaxis in the radial direction, the outer face of at least one ridge having different angles in relation to the midaxis in two predetermined angle ranges in relation to the midaxis.

19 Claims, 13 Drawing Sheets

(51) Int. Cl.
*G02B 19/00* (2006.01)
*H01L 33/58* (2010.01)

(56) References Cited

U.S. PATENT DOCUMENTS

| | | | |
|---|---|---|---|
| 2015/0003081 A1* | 1/2015 | Kobayashi | G02B 3/08 |
| | | | 362/311.02 |
| 2016/0018077 A1* | 1/2016 | Mallory | F21V 5/007 |
| | | | 362/331.02 |
| 2016/0072030 A1 | 3/2016 | Streppel | |
| 2016/0077244 A1* | 3/2016 | Saito | B29C 33/3842 |
| | | | 362/311.06 |
| 2016/0223157 A1* | 8/2016 | Saito | G02B 19/0028 |

* cited by examiner

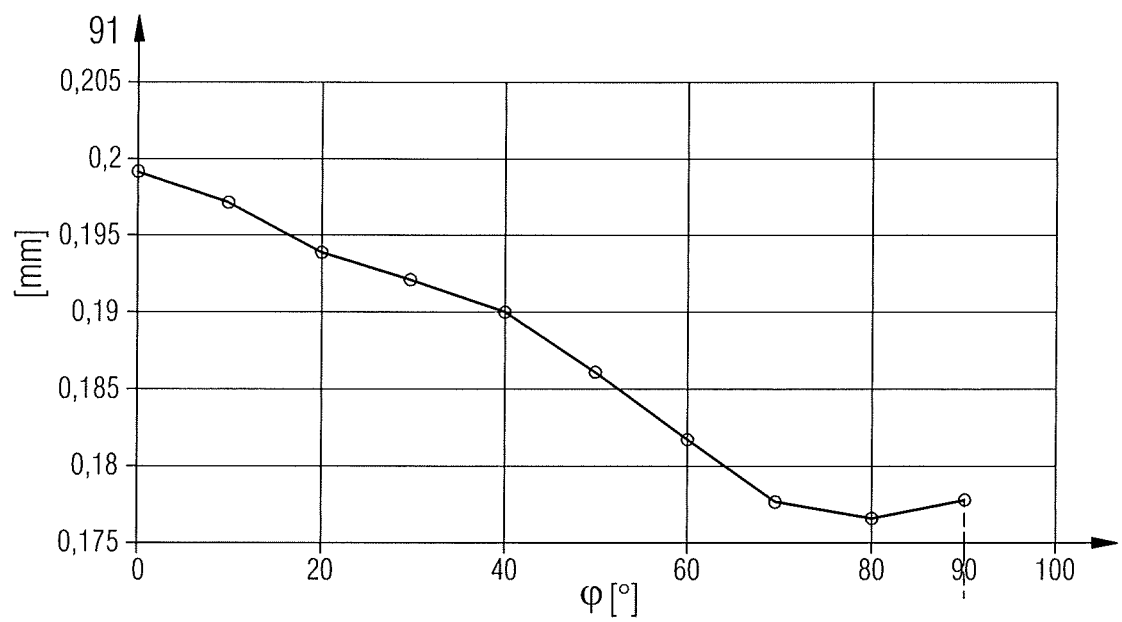

DEVICE THAT ILLUMINATES A DEFINED SURFACE

TECHNICAL FIELD

This disclosure relates to a device that illuminates a predetermined surface region, having a radiation-emitting optoelectronic component and having Fresnel optics.

BACKGROUND

It is known to use Fresnel optics to guide electromagnetic radiation. Fresnel optics comprise a Fresnel structure having annular ridges and annular grooves, the ridges and grooves being arranged circularly and concentrically around an optical midaxis. A ridge has the same shape circumferentially around the midaxis.

It could therefore be helpful to provide a device that illuminates a predetermined surface region and has better optical properties.

SUMMARY

I provide a device that illuminates a predetermined surface region including a radiation-emitting optoelectronic component and Fresnel optics including a Fresnel structure having annular ridges and annular grooves, wherein the ridges are configured as closed rings, the ridges and the grooves enclose an optical midaxis of the Fresnel structure, at least one first section of a ridge has a different shape in a predetermine dangle range in relation to the midaxis than a second section of the ridge in a second angle range, and the ridges of the Fresnel structure include an inner face and an outer face in cross section through a plane of the midaxis, the inner face facing toward the midaxis in the radial direction, the outer face facing away from the midaxis in the radial direction, the outer face of at least one ridge having different angles in relation to the midaxis in two predetermined angle ranges in relation to the midaxis.

BRIEF DESCRIPTION OF THE DRAWINGS

FIG. 25 shows a polar variation of the distance between two adjacent ridges.

Figure 1:
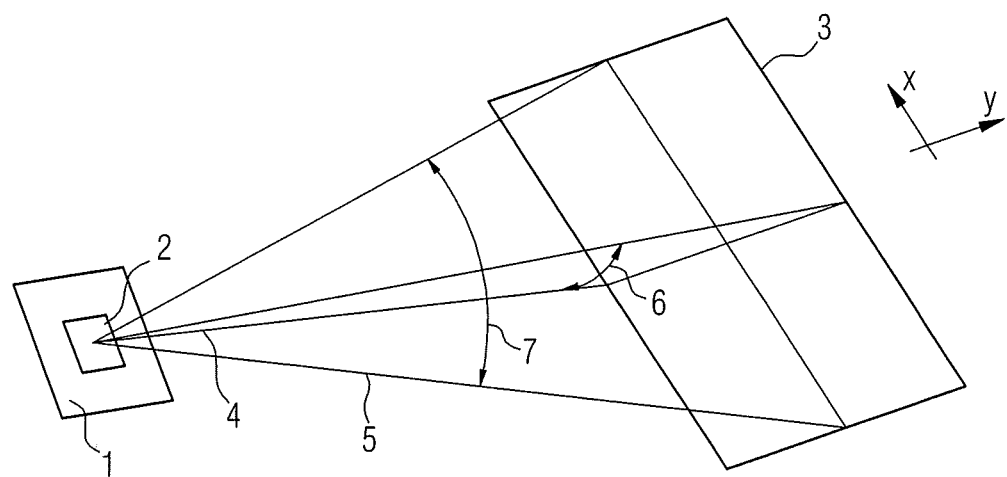
FIG. 1 shows a schematic representation of a light-emitting diode and a predetermined surface region.

LIST OF REFERENCE SIGNS 1 light-emitting diode
2 Fresnel optics
3 surface region
4 light radiation
5 radiation region
6 first angle range
7 second angle range
8 Fresnel structure
9 central region
10 optical midaxis
11 first principal axis
12 second principal axis
13 first diagonal axis
14 second diagonal axis
15 first ridge
16 first groove
17 second ridge
18 third ridge
19 fourth ridge
20 second groove
21 third groove
22 fourth groove
23 first line of points
24 second line of points
25 end face
26 first vertical distance
27 second vertical distance
28 third line of points
29 first horizontal distance
30 second horizontal distance
31 fourth line of points 32 first diagonal distance
33 second diagonal distance
34 axis angle
35 fifth line of points
36 first auxiliary line
37 second auxiliary line
38 central axis angle
39 upper axis angle
40 lower axis angle
41 outer face
42 second side
43 further ridge
44 enlarged representation
45 additional ridge
46 outer angle
47 auxiliary axis
48 lower vertical outer angle curve
49 central vertical outer angle curve
50 upper vertical outer angle curve
51 lower horizontal outer angle curve
52 central horizontal outer angle curve
53 upper horizontal outer angle curve
54 lower diagonal outer angle curve
55 central diagonal outer angle curve
56 upper diagonal outer angle curve
57 reference plane
58 first distance
60 carrier
61 rounding radius
71 first angle range
72 second angle range
73 third angle range
74 fourth angle range
81 first section
82 second section
83 third section
84 fourth section
90 radius of curvature
91 ridge distance

DETAILED DESCRIPTION

One advantage of my device is that improved beam guiding is achieved, which is adapted individually to a desired radiation distribution. For example, a predetermined surface region that is, for example, configured rectangularly or squarely may be illuminated better with the aid of the Fresnel structure. For example, with the aid of a square radiation face, a rectangular surface region may be illuminated with a relatively constant illuminance or one which has a predetermined decrease toward the edge.

My device that illuminates a predetermined surface region, thus, has a radiation-emitting optoelectronic component and Fresnel optics, wherein the Fresnel optics comprise a Fresnel structure having annular ridges and annular grooves, wherein the ridges and the grooves enclose an optical midaxis of the Fresnel structure, wherein at least one first section of a ridge has a different shape in a predetermined angle range in relation to the midaxis than a second section of the ridge in a second angle range. In one configuration, the ridges have an annularly continuous and closed shape. In a similar way, the grooves also have an annularly continuous and closed shape.

The two sections of the ridge in relation to the midaxis may have at least two different radial distances from the midaxis and/or two different radii of curvature with respect to the midaxis. In this way, a simple shape can be provided for asymmetrical beam guiding.

At least two sections of a second ridge may have different radial distances from the midaxis and/or two different radii of curvature in at least two angle ranges in relation to the midaxis. In this way, a simple shape can be provided for asymmetrical beam guiding.

The first and second ridges may constitute adjacent ridges in the radial direction, the two ridges being separated by a groove. In this example, directing of radiation can be improved.

Two sections of a ridge may have equally large radial distances from the midaxis and/or equally large radii of curvature in two angle ranges arranged mirror-symmetrically with respect to a straight line through the midaxis. In this way, symmetry is achieved in the illumination. The two angle ranges may, for example, cover 90°. The two angle ranges may also cover 180°.

A ridge may be configured mirror-symmetrically with respect to a first straight line in relation to the radial distances from the midaxis and in relation to the radii of curvature, the first straight line extending through the midaxis of the Fresnel structure. Furthermore, the ridge may be configured mirror-symmetrically with respect to a second straight line in relation to the radial distances from the midaxis and in relation to the radii of curvature, the second straight line extending through the midaxis of the Fresnel structure and the second straight line being perpendicular to the first straight line. In this way, symmetry is achieved in the illumination.

A plurality of ridges may be configured mirror-symmetrically with respect to a first straight line in relation to the radial distances from the midaxis and in relation to the radii of curvature, the first straight line extending through the midaxis of the Fresnel structure. Furthermore, the ridges may be configured mirror-symmetrically with respect to a second straight line in relation to the radial distances from the midaxis and in relation to the radii of curvature, the second straight line extending through the midaxis of the Fresnel structure and the second straight line being perpendicular to the first straight line. In this way, improved symmetry is achieved in the illumination.

Transition angle ranges may be provided between the angle ranges and the further angle ranges, the different radial distances and radii of curvature of the sections of the one ridge merging into one another, in particular merging continuously into one another, in the transition angle ranges. More uniform beam guiding is achieved by the transition angle range.

The ridges of the Fresnel structure may comprise an inner face and an outer face in cross section through a plane of the midaxis, the inner face facing toward the midaxis in the radial direction, the outer face facing away from the midaxis in the radial direction, the outer faces of at least two ridges having different angles in relation to the midaxis in a predetermined angle range in relation to the midaxis, a ridge lying further away from the midaxis in the radial direction comprising an outer face with a larger angle compared to an outer face of a further ridge, the further ridge being arranged closer to the midaxis in the radial direction. Improved beam guiding is thereby achieved.

The ridges of the Fresnel structure may comprise an inner face and an outer face in cross section through a plane of the midaxis, the inner face facing toward the midaxis in the radial direction, the outer face facing away from the midaxis in the radial direction, the outer face of at least one ridge having different angles in relation to the midaxis in two predetermined angle ranges in relation to the midaxis. A further improvement of the beam guiding can thereby be achieved.

The outer faces of two sections of a ridge may have equally large angles in relation to the midaxis in two angle ranges arranged mirror-symmetrically with respect to a straight line through the midaxis. In this way, a symmetrical radiation distribution can be reinforced. The two angle ranges may, for example, cover 90°. The two angle ranges may also cover 180°.

The outer faces of two further sections of the ridge may have equally large angles with respect to the midaxis in two further angle ranges arranged mirror-symmetrically with respect to the midaxis. The two angle ranges may, for example, cover 90°. The two angle ranges may also cover 180°.

A ridge may be configured mirror-symmetrically with respect to a first straight line in relation to the angles of the outer faces, the first straight line extending through the midaxis of the Fresnel structure. Furthermore, the ridge may be configured mirror-symmetrically with respect to a second straight line in relation to the angles of the outer faces, the second straight line extending through the midaxis of the Fresnel structure, and the second straight line being perpendicular to the first straight line. In this way, a symmetry is achieved in the illumination.

A plurality of ridges may be configured mirror-symmetrically with respect to a first straight line in relation to the angles of the outer faces, the first straight line extending through the midaxis of the Fresnel structure. Furthermore, the ridges may be configured mirror-symmetrically with respect to a second straight line in relation to the angles of the outer faces, the second straight line extending through the midaxis of the Fresnel structure, and the second straight line being perpendicular to the first straight line. In this way, an improved symmetry is achieved in the illumination.

Transition angle ranges may be provided between the angle ranges and the further angle ranges, the different angles of the outer faces of the sections of the one ridge merging into one another in the transition angle ranges. In this way, an improved light distribution is achieved.

The ridges may comprise upper end faces, the end faces of the ridges having a height position relative to a reference plane, the reference plane being arranged perpendicularly to the midaxis, at least the end faces of two ridges having different height positions relative to the reference plane. In this way as well, a positive influence on the beam guiding is achieved.

The height differences of the end faces of the ridges may follow a parabolic function with a local minimum starting with a first innermost ridge as far as a predetermined number of outer ridges.

The ridges may comprise end faces, the end faces of the ridges having rounding radii in a cross section through the midaxis, at least the rounding radii of end faces of two ridges being different.

At least one ridge, in particular at least two ridges, may be arranged neither circularly nor elliptically around the midaxis.

The outer face of a ridge may have an angle in relation to the optical midaxis having a maximum value in the region of the first principal axis. The angle decreases with the polar angle in the direction of the second principal axis. In this example, the angle may increase again in the direction of the second principal axis after a predetermined polar angle, for example, 60° is exceeded. In particular, the decrease of the angle of the outer face and the increase of the angle of the outer face may be configured constantly. A plurality of ridges may comprise corresponding outer faces with corresponding angles. Furthermore, the angles of the outer faces of the ridges may vary from one another. The angles of the outer faces of the ridges may be configured mirror-symmetrically with respect to the first principal axis and/or with respect to the second principal axis.

Two adjacent ridges of the Fresnel structure may have a radial distance from one another that varies with a polar angle about the midaxis of the Fresnel structure. The distance of the two adjacent ridges may have a maximum value in the region of the first principal axis, the distance decreasing, particular decreasing constantly, along a polar angle about the midaxis of the Fresnel structure in the direction of the second principal axis. The distance of the two ridges may have a minimum value at a predetermined polar angle of, for example, 80° and subsequently increase again, in particular increase continuously in the direction of the polar angle of 90°. At least three or more ridges may have corresponding radial distances from adjacent ridges.

The above-described properties, features and advantages, as well as the way in which they are achieved, will become more clearly and readily comprehensible in conjunction with the following description of examples that are explained in more detail in connection with the drawings.

FIG. 1 shows a schematic representation of a radiation-emitting optoelectronic component in the form of a light-emitting diode 1 having Fresnel optics 2 and a predetermined surface region 3 intended to be illuminated by the light-emitting diode 1. The radiation-emitting optoelectronic component may also be configured in other forms. For example, the radiation-emitting optoelectronic component may be configured as a radiation-emitting semiconductor chip, in particular as a semiconductor diode, in particular as a laser diode. My devices will be explained below with reference to the example of the light-emitting diode 1, although the Fresnel optics may also be used for any other type of the radiation-emitting optoelectronic component to illuminate a desired surface region.

The surface region 3 constitutes a planar target region intended to be illuminated uniformly by the light-emitting diode 1. The light-emitting diode 1 may, for example, be configured in the form of a light-emitting diode or laser diode. The light-emitting diode 1 comprises a square emission face. The surface region 3 represented is configured as a rectangular surface region having a greater extent in an x axis than in a y axis. The light-emitting diode 1 generates electromagnetic radiation, in particular visible or invisible light directed by the Fresnel optics 2 onto the surface region 3. After the Fresnel optics 2, the light radiation 4 has a radiation region 5 comprising a first emission angle range 6 along the y axis and a second emission angle range 7 along the x axis. The first and second emission angle ranges 6, 7 constitute a radiation cone. The surface region 3 may also be square or have a different shape. The emission angle ranges 6, 7 may be 1° to 180°, in particular 70° to 150°.

Figure 2:
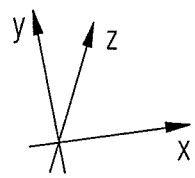
FIG. 2 shows a perspective representation of Fresnel optics with a view of a Fresnel structure.
Figure 2:
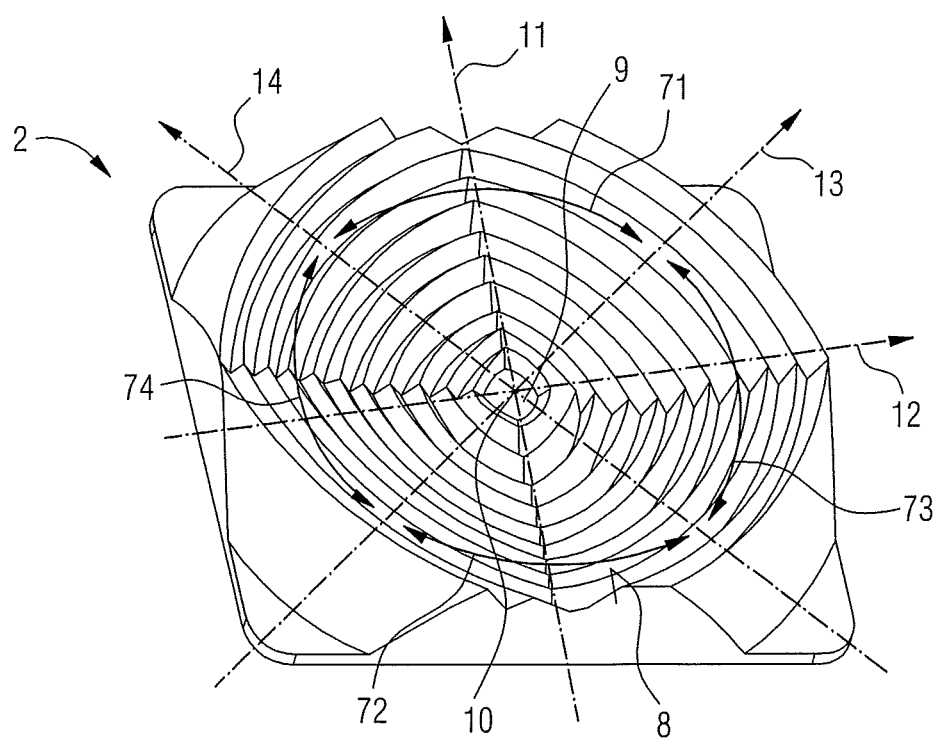

FIG. 2 shows a perspective representation of the Fresnel optics 2 with a view of a Fresnel structure 8. The Fresnel structure 8 comprises a central region 9, in which an optical midaxis 10 that represents an optical axis of the Fresnel structure is arranged. The Fresnel structure 8 is arranged in an x-y plane. The optical axis 10 is perpendicular to the x-y plane in the central region 9. The surface of the Fresnel structure 8 may be subdivided by an imaginary first principal axis 11 and an imaginary second principal axis 12 perpendicular thereto. The first and second principal axes 11, 12 intersect in the optical axis 10 in the central region 9. In addition, an imaginary first diagonal axis 13 is represented between the first and second principal axes 11, 12. Furthermore, a second diagonal axis 14 is provided perpendicularly to the first diagonal axis 13.

The Fresnel structure 8 comprises ridges 15 and grooves 16 arranged annularly circumferentially around the central region 9. A first groove 16 is provided between the central region 9 and a first ridge 15. A groove 16 is arranged between two ridges in the radial direction extending outward. In the example, the ridges and grooves are not arranged annularly around the central region 9, but are configured noncircularly and have a rotationally nonsymmetrical shape. Furthermore, a first angle range 71 and a second angle range 72 are represented and arranged symmetrically with respect to the second principal axis 12. In addition, a third and a fourth angle range 73, 74 are represented and arranged symmetrically with respect to the first principal axis 11.

The Fresnel structure 8 of the Fresnel optics 2 is configured such that a TIR Fresnel lens is formed. In the mounted state, the Fresnel structure 8 provides faces oriented toward the light-emitting diode 1. An opposite second side of the Fresnel optics 2 may be configured as a planar surface and is arranged perpendicularly to the optical axis 10. The Fresnel optics 2 may be formed from a material which optically has a higher refractive index than air. The Fresnel optics 2 may be formed, for example, from glass, plastic or epoxy resin.

Figure 3:
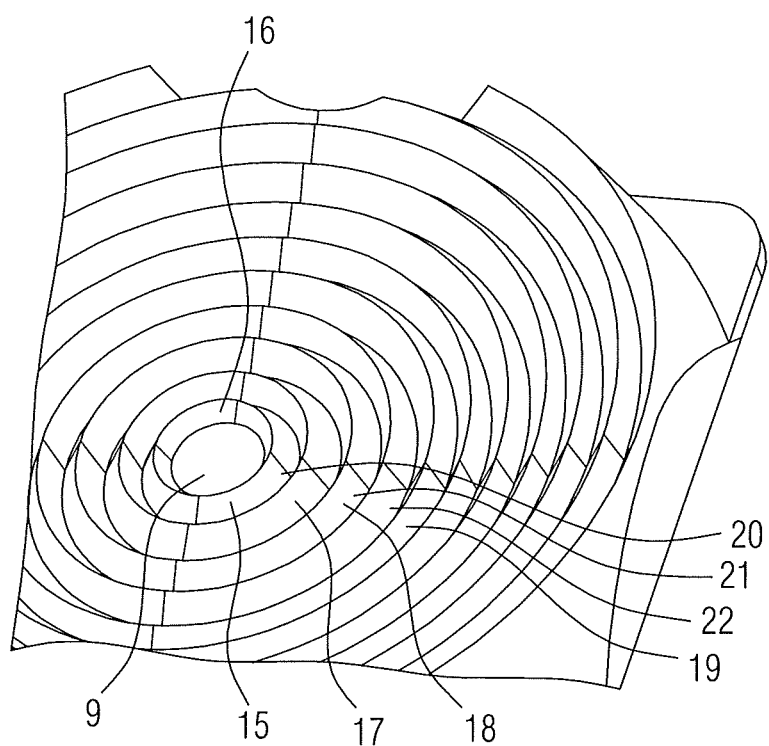
FIG. 3 shows a partial detail of the Fresnel optics of FIG. 2.

FIG. 3 shows an enlarged detail of the Fresnel structure 8 of the Fresnel optics 2 of FIG. 2, the central region 9 being configured as a planar, in particular annular surface. The central region 9 is enclosed by a first groove 16. A first ridge 15 follows in the radial direction outward. In the radial direction outward starting from the ridge 15, a second ridge 17, a third ridge 18 and a fourth ridge 19, . . . , are arranged and each separated by grooves 16, 20, 21, 22. For a clear representation, not all ridges and grooves are provided with reference signs.

The ridges 15, 17, 18, 19 and grooves 16, 20, 21, 22 are arranged noncircularly and rotationally nonsymmetrically around the optical axis 10, but in one example have different radial distances from the optical axis 10, depending on an angular position in the x-y plane in relation to the optical axis 10. In this way, at least one first section of a ridge has a different shape in a predetermined angle range about the midaxis 10, i.e., in particular a different curvature in the x-y plane, than a second section of the same ridge in a second angle range. The first ridge 15 arranged adjacent to the central region 9 may also be configured annularly.

However, even the first ridge 15 may also have a noncircular shape, but have a smaller distance in a horizontal direction, i.e., in the direction of the second principal axis 12, than in the direction of the first principal axis 11 from the optical axis 10. Furthermore, the first ridge 15 may likewise have a radial distance from the optical axis 10 in a diagonal direction, i.e., in the direction of the first diagonal axis 13 or of the second diagonal axis 14, which is smaller than in the direction of the first principal axis 11.

Furthermore, the radial distance of the first ridge 15 from the optical axis 10 may be smaller in the horizontal direction than in the diagonal direction.

Each ridge 15, 17, 18, 19 may have a noncircular shape, but have a smaller or greater distance from the diagonal axis in at least one angular direction than in another angular direction. For example, each ridge may have a smaller distance in a horizontal direction, i.e., in the direction of the second principal axis 12, than in the direction of the first principal axis 11 from the optical axis 10. For example, the ridges 15, 17, 18, 19 may have a radial distance from the optical axis 10 in a diagonal direction, i.e., in the direction of the first diagonal axis 13 or of the second diagonal axis 14 that is smaller than in the direction of the first principal axis 11.

Furthermore, the radial distances of the ridges from the optical axis 10 may be smaller in the horizontal direction than in the diagonal direction.

The distances of the grooves 16, 20, 21, 22 arranged between the ridges 15, 17, 18, 19, may also behave in a similar way. Each groove may have a noncircular shape, but has a smaller or greater distance from the diagonal axis in at least one angular direction than in another angular direction. For example, each groove may have a smaller distance in a horizontal direction, i.e., in the direction of the second principal axis 12, than in the direction of the first principal axis 11 from the optical axis 10. For example, the grooves may have a radial distance from the optical axis 10 in a diagonal direction, i.e., in the direction of the first diagonal axis 13 or the second diagonal axis 14, which is smaller than in the direction of the first principal axis 11.

Furthermore, the radial distances of the grooves from the optical axis 10 may be smaller in the horizontal direction than in the diagonal direction.

At least two sections of the ridge have at least two different radial distances from the midaxis in relation to the midaxis and, therefore, also different radii of curvature. The radius of curvature is defined by the curvature of the ridge in a plane perpendicular to the midaxis 10 and starting from the midaxis 10. The midaxis 10 forms a center of curvature of a curvature line of the ridge arranged in a plane perpendicular to the midaxis 10. The radius of curvature of the ridge or ridges may change in sections or continuously along a polar angle about the midaxis 10 of the Fresnel structure. The curvature of the ridge or ridges may have different shapes along a polar angle about the midaxis, in particular semicircular, semielliptical or have an arbitrary free shape.

At least two sections of a ridge, in two angle ranges, are arranged mirror-symmetrically with respect to the midaxis, and have equally large radial distances from the midaxis and equally large radii of curvature. The two angle ranges may, for example, cover 90°. The two angle ranges may also cover 180°.

Two sections of a ridge may be configured mirror-symmetrically with respect to a straight line in relation to the radial distances from the midaxis and in relation to the radii of curvature, the straight line extending through the midaxis of the Fresnel structure. In particular, the two sections of the ridge extend over 180°.

A ridge may be configured mirror-symmetrically with respect to a first straight line in relation to the radial distances from the midaxis and in relation to the radii of curvature, the first straight line representing, for example, the first principal axis 11. Furthermore, the ridge may be configured mirror-symmetrically with respect to a second straight line in relation to the radial distances from the midaxis and in relation to the radii of curvature, the second straight line representing, for example, the second principal axis 12.

A plurality of ridges may be configured mirror-symmetrically with respect to the first principal axis 11 in relation to the radial distances from the midaxis and in relation to the radii of curvature. Furthermore, the ridges may be configured mirror-symmetrically with respect to the second principal axis 12 in relation to the radial distances from the midaxis and in relation to the radii of curvature.

Figure 4:
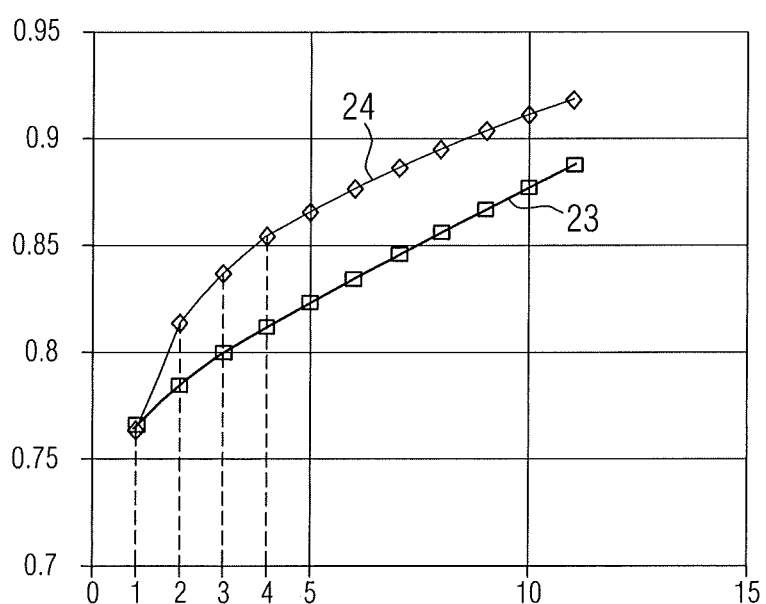
FIG. 4 shows a diagram in which the radial distance of the ridges of the Fresnel structures in the horizontal and diagonal directions are plotted.

FIG. 4 shows in a schematic representation a diagram in which the diagonal distances and the horizontal distances of the ridges are indicated as a function of the vertical distances. On the x axis, the ridges are denoted by the position numbers 1 to 11, the innermost ridge being denoted by the number 1 and the outermost ridge being denoted by the number 11. On the y axis, the distances are indicated as a function of a vertical distance of the respective ridge.

In a first line of points 23, the horizontal distances of the ridges from the optical axis 10 are represented, a value being indicated for each ridge. In a second line of points 24, the diagonal distances of the ridges from the optical axis 10 are represented, a value being indicated for each ridge.

The distances in the diagonal direction and in the horizontal direction in this example are equally large for the first ridge. The radial distances are equal to a value of 0.77 of the vertical distance of the first ridge in the first principal axis 11. The first line of points 23 shows that the distance in the horizontal direction increases approximately linearly outward, i.e., with an increase of the position number of the ridge. The second line of points 24 shows that the distance in the diagonal direction increases outward with an increase in the position of the ridge more greatly from the first to the second ridge than for the further ridges. Furthermore, the distances of the ridges in the diagonal direction, i.e., in the direction of the first and second diagonal axes 13, 14, are greater than the distances in the horizontal direction, i.e., in the direction of the second principal axis 12 for ridges with a position of 2 or more. The lines of points 23, 24 represented represent average values for a band range which the ridges can assume. For example, the band range is +−10% of the values represented.

Figure 5:
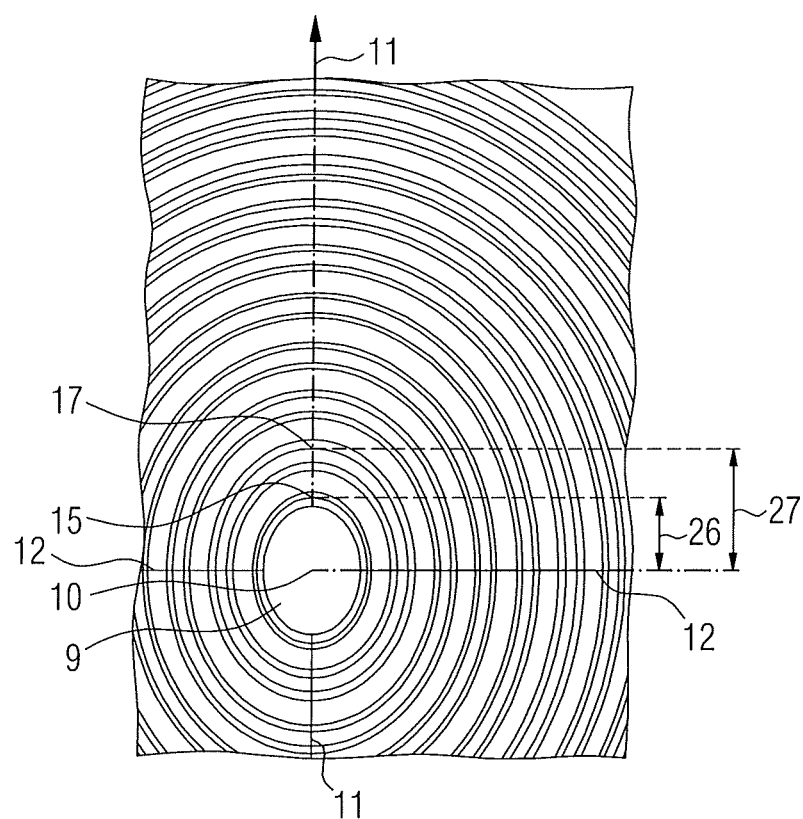
FIG. 5 shows a plan view of a partial detail of the Fresnel structure of FIG. 1 with an indication of the distances of the ridges from the midaxis in the vertical direction.

FIG. 5 shows a detail of a plan view of the Fresnel structure 8 with an indication of various vertical distances of the ridges 15, 17, 18, 19. The vertical direction corresponds to the first principal axis 11. A first ridge 15 has a first distance 26, a second ridge 17 has a second distance 27 from the optical axis 10.

Figure 6:
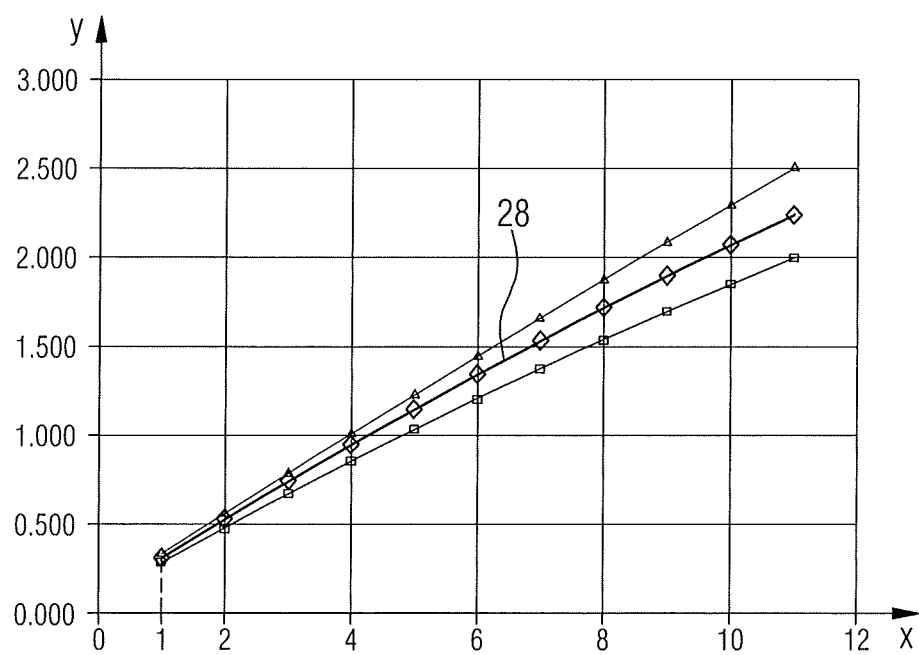
FIG. 6 shows a diagram of the vertical distances of the ridges of the Fresnel structure from the midaxis.

FIG. 6 shows a diagram in which the vertical distances of the ridges from the optical axis are indicated as a function of a width of an emission face of the light-emitting diode. On the x axis, the ridges are denoted by the position numbers 1 to 11, the innermost ridge being denoted by the number 1 and the outermost ridge being denoted by the number 11. On the y axis, widths of an emission face of the light-emitting diode are indicated as a unit. A third line of points 28 represents the distances along the first principal axis 11 for the ridges. The third line of points 28 essentially represents a straight line. The distance of the ridges therefore increases continuously along the principal axis 11 essentially with the same value outward from ridge to ridge. The ridges may also have vertical distances which lie in the range of +−10% of the values represented as represented with the aid of auxiliary lines 36, 37. The first ridge 15 may have a distance of 0.300 of a width of an emission face of a light-emitting diode. The second ridge 17 may have a distance of 0.5 times the width of the emission face of the light-emitting diode. The distance of the ridges from the optical axis 10 is, for example, established by the positions of upper end faces of the ridges. The upper end face of the ridge establishes the highest position of the ridge. The end face may be configured to be rounded with a rounding radius or as an edge.

Figure 7:
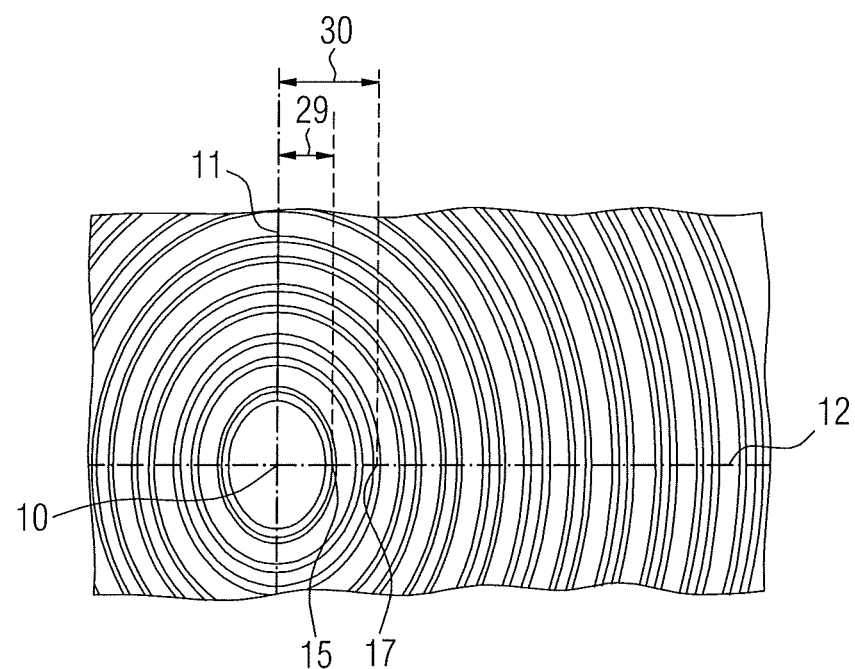
FIG. 7 shows a plan view of a partial detail of the Fresnel structure with an indication of the distances in the horizontal direction.

FIG. 7 shows a partial detail of the Fresnel structure 8, horizontal distances of the first and second ridges from the optical axis 10 being indicated. The end face 25 of the first ridge 15 has a first horizontal distance 29 from the optical axis 10. The end face 25 of the second ridge 17 has a second horizontal distance 30 from the optical axis 10.

Figure 8:
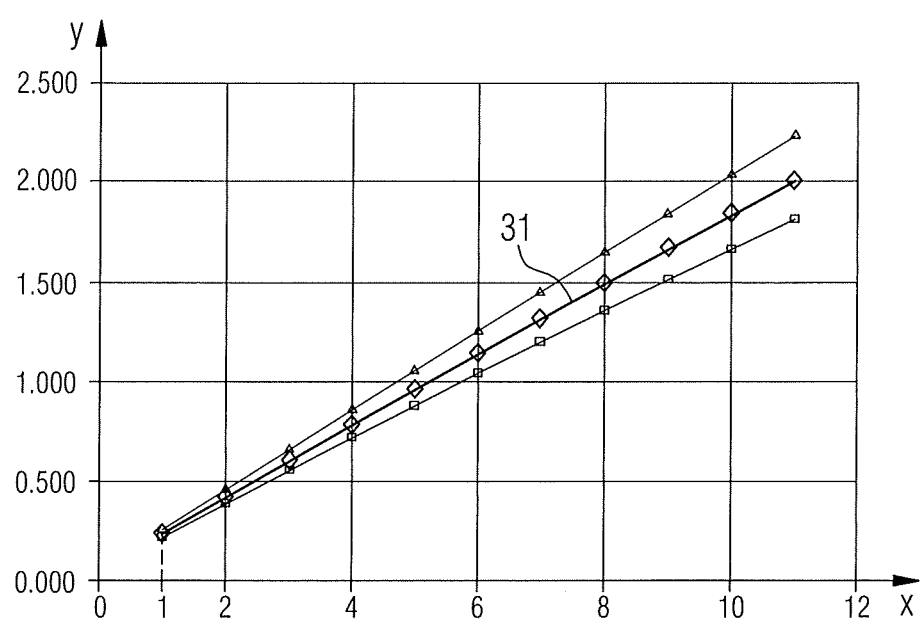
FIG. 8 shows a diagram with an indication of the distances of the ridges of the Fresnel structures in the horizontal direction.

FIG. 8 shows in a diagram a fourth line of points 31 for the horizontal distances of the ridges. On the x axis, the ridges are denoted by the position numbers 1 to 11, the innermost ridge being denoted by the number 1 and the outermost ridge being denoted by the number 11. On the y axis, widths of an emission face of a light-emitting diode are indicated as a unit, in particular as a function of a width of a light-emitting diode. The first ridge 15 has, for example, a distance of 0.25 of the width of an emission face of the light-emitting diode from the optical axis 10. The second ridge 17 has, for example, a distance of 0.4 times the width of the emission face of the light-emitting diode from the optical axis 10.

In the horizontal direction, for example, the first ridge may have a distance of 0.24 times the width of the emission face of the light-emitting diode from the optical axis 10. In addition, in the horizontal direction, the distance of the ridges may change from ridge to ridge outward respectively by the value of 0.18 times the width of the emission face of the light-emitting diode. Furthermore, the distances in the horizontal direction may vary in a range of +−10% around the values represented, as the auxiliary lines 36, 37 represented indicate.

The horizontal distances of the ridges may vary in a range of 0.2 times the width of the emission face of the light-emitting diode and up to 2 times the width of the emission face of the light-emitting diode.

There may be the following size ratios: a light-emitting diode may, for example, have an emission face with a width of 1 mm. The light-emitting diode may be produced in the form of a semiconductor chip. The light-emitting diode may comprise a square or rectangular emission face. For example, the first ridge 15 may have a distance of 0.31 times the width of the emission face of the light-emitting diode in the vertical direction, i.e., along the principal axis 11. In addition, in the vertical direction, the distance of the ridges may increase from ridge to ridge respectively by a value of 0.22 times the width of the emission face of the light-emitting diode. Furthermore, the distances of the ridges may respectively deviate by +−10% from the values represented. Overall, the vertical distances of the ridges may vary in a bandwidth of 0.3 to 2.3 times the width of the emission face of the light-emitting diode.

Figure 9:
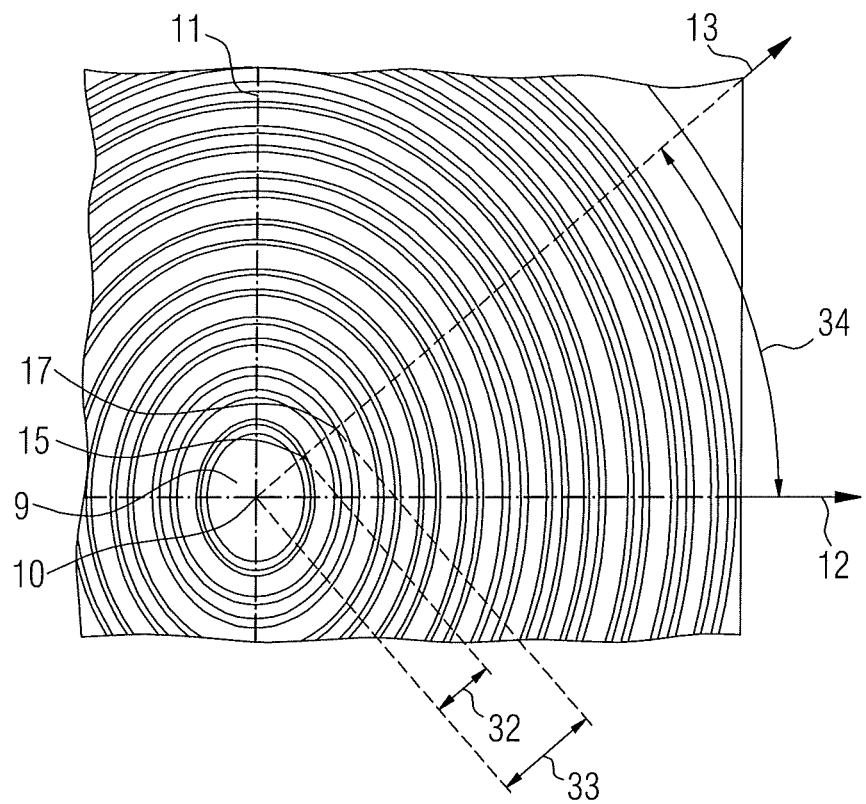
FIG. 9 shows a plan view of a partial detail of the Fresnel structure of FIG. 1 with an indication of diagonal distances of ridges from the midaxis.

FIG. 9 shows a partial detail of the Fresnel structure 8 of the Fresnel optics 2, diagonal distances 32, 33 for the first ridge 15 and the second ridge 17 along the first diagonal axis 13 being indicated. Furthermore, an axis angle 34 is represented that is, for example, 45°. The axis angle 34 indicates the angular position of the first or the second diagonal axis 13, 14 in relation to the horizontal axis, i.e., the second principal axis 12.

Figure 10:
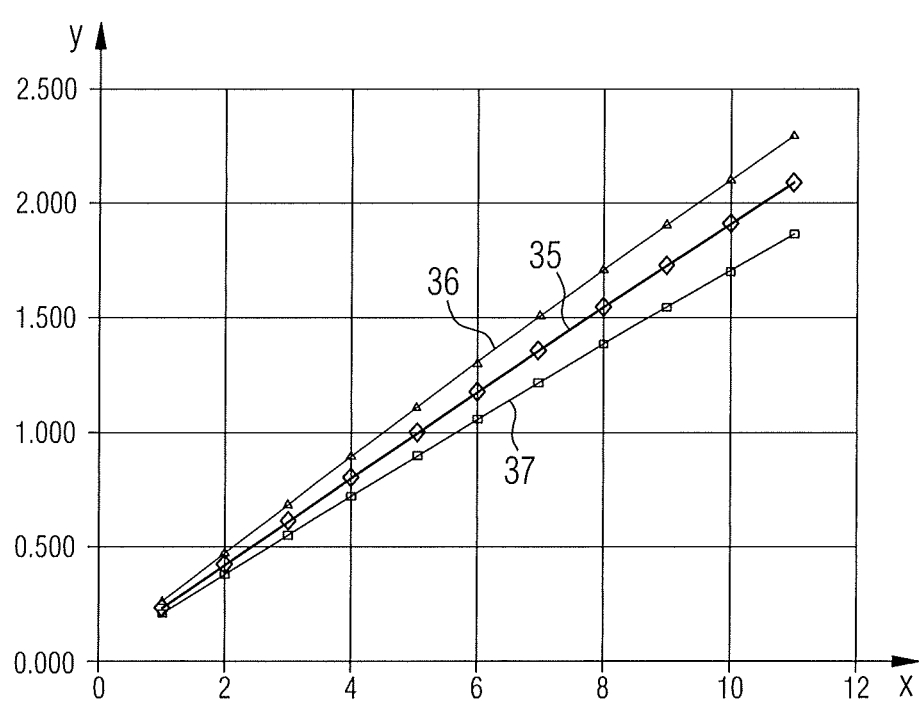
FIG. 10 shows a diagram with an indication of distances of the ridges from the midaxis in the diagonal direction.

FIG. 10 shows in a schematic representation a diagram in which a fifth line of points 35 indicates the diagonal distances of the ridges as a function of a proportion of a width of the emission face of the light-emitting diode. On the x axis, the ridges are denoted by the position numbers 1 to 11. On the y axis, widths of the emission face of the light-emitting diode are indicated as a unit. The individual distances are connected to one another in the form of the fifth line of points 35. The diagonal distances may also deviate by +40% from the values indicated. These deviations are represented schematically by an upper auxiliary line and a lower auxiliary line. For example, the first ridge 15 has a first diagonal distance 32 that is 0.24 times the width of the emission face of the light-emitting diode. The second ridge 17 has, for example, a second diagonal distance 33 that is 0.44 times the emission face of the light-emitting diode. The diagonal distances may vary in a bandwidth of 0.2 to 2.3 times the width of the emission face of the light-emitting diode.

The width of the emission face may be established by the width of a light-emitting semiconductor chip, in particular a width of an emission face of a light-emitting diode.

Figure 11:
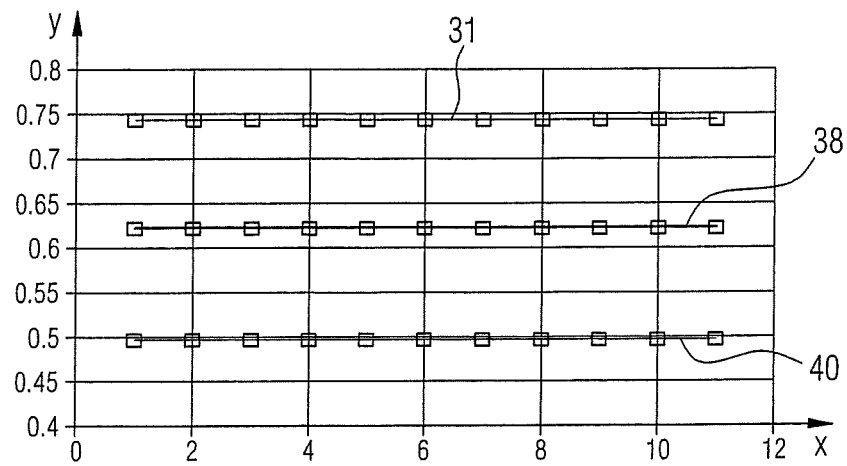
FIG. 11 shows a diagram with an indication of a diagonal axis angle for one angular position of the diagonal axes.

FIG. 11 shows in a schematic representation for the Fresnel structure of the Fresnel optics possible axis angles 34 for the diagonal axes 13, 14 for the individual ridges. On the x axis, the ridges are represented with an indication of the position from 1 to 11. The first position corresponds to the first ridge, and the eleventh position corresponds to the eleventh ridge starting from the optical axis 10 in the radial direction outward. On the y axis, an emission angle of the light-emitting diode in an x or y plane is indicated as a unit. In the example, the axis angle 34 for the first and second diagonal axes 13, 14 may extend in the range of 0.5 to 0.75 of the maximum emission angle in the horizontal direction, i.e., in the x plane. In the diagram, a central axis angle 38 of 0.62 times the horizontal emission angle of the light-emitting diode is indicated. In the example, the central axis angle 38 is equally large for all ridges. Furthermore, an upper axis angle 39 is indicated that is 0.75 times the diagonal emission angle. The upper axis angle 39 may in one example be equally large for all ridges. Furthermore, a lower axis angle 40 of 0.5 times the diagonal emission angle of the light-emitting diode is indicated. The lower axis angle 40 may be equally large for all ridges. The diagonal axis angles for the individual ridges may vary in the described range between the central axis angle and the lower axis angle.

Figure 12:
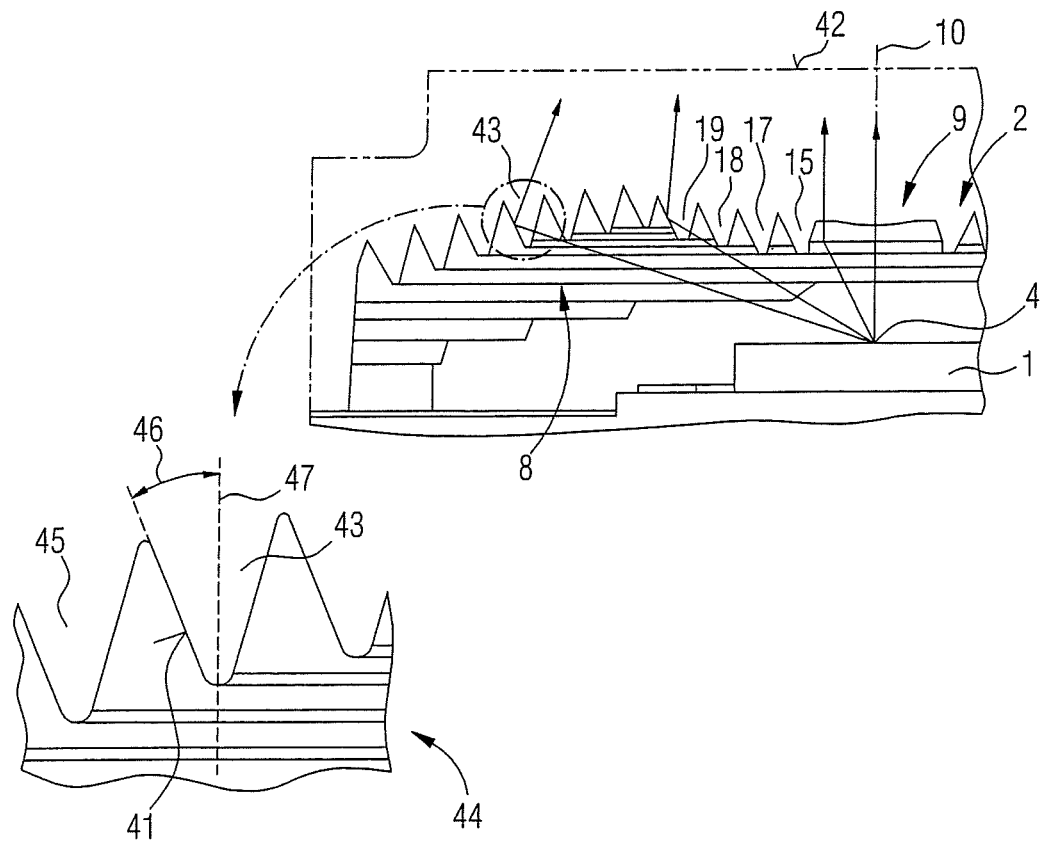
FIG. 12 shows a partial cross section through the Fresnel optics of FIG. 1 and an enlarged detail.

FIG. 12 shows a partial cross section through the Fresnel structure 8 of the Fresnel optics 2. In this example, a light-emitting diode 1 emits electromagnetic radiation 4 onto the Fresnel structure 8 of the Fresnel optics 2. Depending on the beam path of the electromagnetic radiation 4, the electromagnetic radiation 4 is refracted or reflected in different ways at the Fresnel structure 8 of the Fresnel optics 2. In reflection, in particular outer faces 41 of the ridges 15, 17, 18, 19 are important. Orientation of the outer faces 41 in relation to the midaxis 10 dictates the emission direction of the electromagnetic radiation 4 when leaving the second side 42 of the Fresnel optics 2.

In an enlarged partial detail 44 of the Fresnel optics 2, a cross section of a further ridge 43 is represented. The further ridge 43 has an outer face 41 facing away from the optical axis 10 as seen in the radial direction. The outer face 41 at the same time forms the groove between the further ridge 43 and an additional ridge 45 lying further outward as seen in the radial direction. Each of the ridges comprises an outer face 41. The outer face 41 has an outer angle 46, i.e., an angle relative to an auxiliary axis 47 arranged parallel to the optical axis 10. The outer faces 41 of the ridges may have different outer angles 46 in relation to the optical axis 10. Furthermore, the outer face of a ridge may have different outer angles 46 in relation to the optical axis 10 depending on the angular position along a polar angle about the optical axis 10, i.e., the midaxis.

Figure 13:
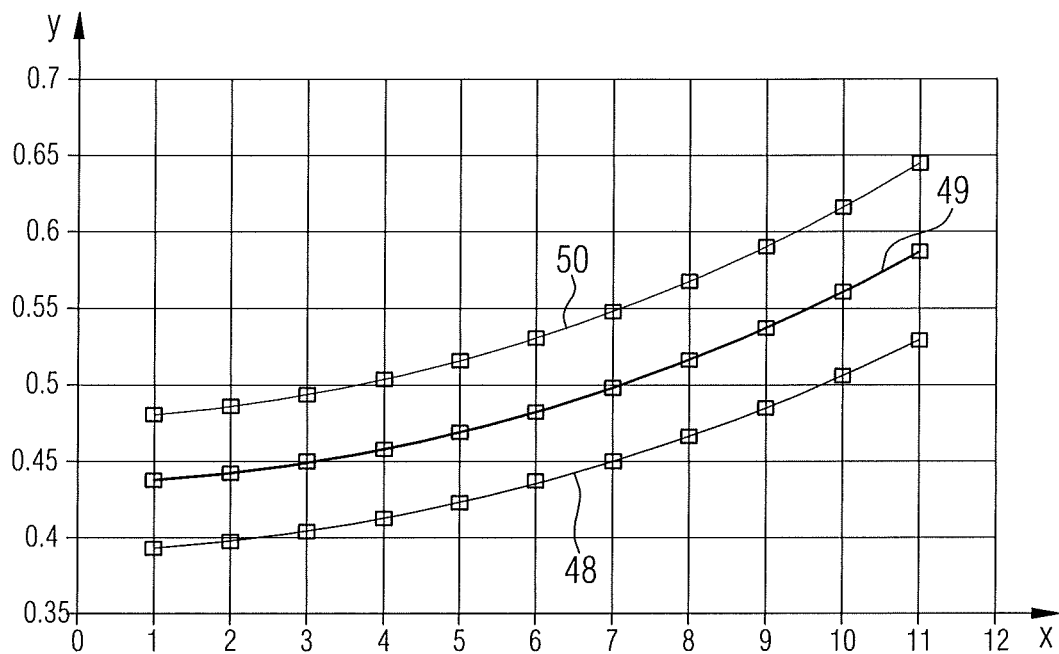
FIG. 13 shows a diagram with an indication of the angles of the outer faces for the ridges of the Fresnel structure in the vertical direction.

FIG. 13 shows in a diagram values for the outer angles 46 of the outer faces 41 of the ridges of the Fresnel structure 8 in the vertical direction, i.e., in the direction of the first principal axis 11. In this example, the ridges are represented on the x axis with an indication of the radial position number. The radially innermost ridge is denoted by 1, and the radially outermost ridge is denoted by 11. Along the y axis, a vertical emission angle of the light-emitting diode 1 in the plane of the first principal axis 11 is indicated as a unit. A lower axis angle curve 48 indicates the axis angles for the ridges of a first example. A central axis angle curve 49 indicates the axis angles of the ridges for a second example. An upper axis angle curve 50 indicates the axis angles for the ridges of a third example. In each example, the size of the axis angles increases outward from ridge to ridge starting with the radially innermost ridge as seen in the radial direction. In this example, the profile of the axis angles may follow a nonlinear, for example, parabolic function. Furthermore, the axis angles may vary by +−10% of the values represented. In particular, the axis angles may lie in an angle range of 0.35 times the vertical emission angle of the light-emitting diode to 0.7 times the vertical emission angle of the light-emitting diode.

Figure 14:
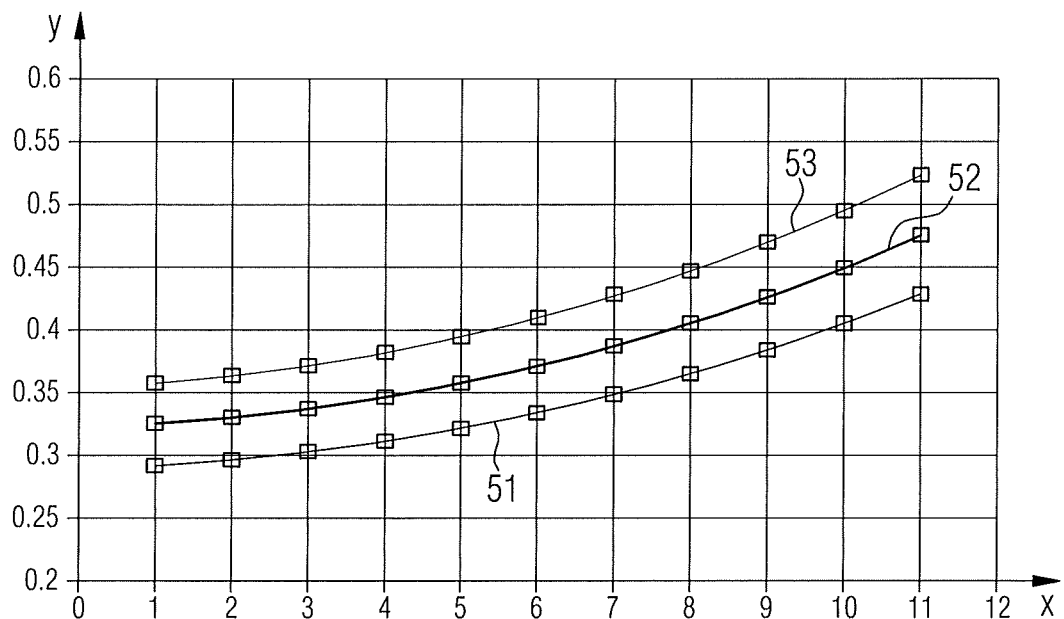
FIG. 14 shows a diagram with an indication of the angles of the outer faces for the ridges of the Fresnel structure in the horizontal direction.

FIG. 14 shows a diagram of the axis angles in the horizontal direction, i.e., along the second principal axis 12. In the diagram, the ridges are indicated along the x axis with an indication of the position number as seen from the inside outward in the radial direction. On the y axis, a horizontal emission angle of the light-emitting diode 1 is indicated as a unit. For example, the entire range for the horizontal axis angles is 0.25 to 0.55 times the horizontal emission angle of the light-emitting diode 1. A lower horizontal axis angle curve 51 is indicated that indicates the outer angles of the outer faces for the ridges for one example of the Fresnel structure 8. Furthermore, a central horizontal axis angle curve 52 indicates the outer angles 46 of the outer faces 41 for a second example of the Fresnel optics. Furthermore, an upper horizontal axis angle curve 53 is provided that indicates the outer angles of the outer faces of the Fresnel structure 8 for a third example. The profile of the outer angles may follow a nonlinear, for example, parabolic function. The horizontal outer angles of the outer faces increase outward as seen in the radial direction starting with the ridge at the radially innermost position that has the position number 1, as far as the ridge which has the position number 11.

Figure 15:
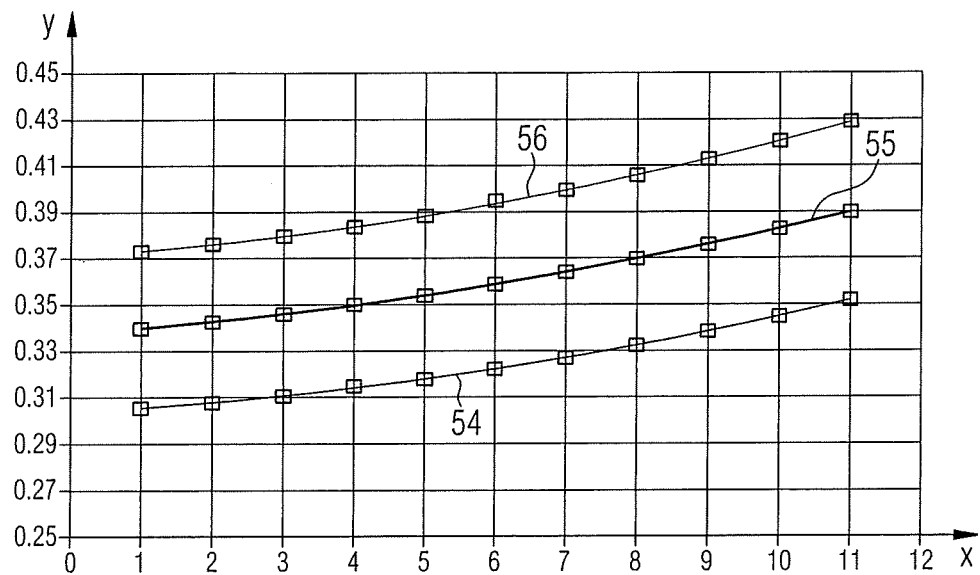
FIG. 15 shows a diagram with an indication of the angles of the outer faces for the ridges of the Fresnel structure in the diagonal direction.

FIG. 15 shows a diagram of the diagonal outer angles of the outer faces of the ridges of the Fresnel structure 8 of the Fresnel optics 2 along the first or second diagonal axis 13, 14. In the diagram, the position numbers of the ridges are indicated along the x axis, the innermost ridge being denoted by 1 and the outermost ridge as seen in the radial direction being denoted by 11. The diagonal direction is defined by the first and second diagonal axes 13, 14. On they axis, a horizontal emission angle of the light-emitting diode 1 is indicated as a unit.

The diagonal outer angles may vary by 0.3 times the diagonal emission angle of the light-emitting diode to 0.45 times the diagonal emission angle of the light-emitting diode. A lower diagonal outer angle curve for a first example is represented. The lower diagonal outer angle curve 54 indicates the values of the outer angles of the outer faces of the ridges. In addition, for a second example, a central diagonal outer angle curve 55 for a second example is indicated. The central diagonal outer angle curve 55 indicates the outer angles of the outer faces of the ridges. Furthermore, an upper diagonal outer angle curve 56 is indicated. The upper diagonal outer angle curve 56 indicates the outer angles of the outer faces of the ridges for a third example. The outer angles may also vary in the ranges indicated. The diagonal outer angles of the outer faces of the ridges increase outward as seen in the radial direction starting with the innermost ridge. The profile of the outer angles may follow a nonlinear, in particular parabolic function. Furthermore, the outer angles of the outer faces may also have a bandwidth of +−10% in relation to the values represented. In particular, the innermost ridge denoted by the position number 1, may have a starting angle of 0.34 times the horizontal emission angle.

Figure 16:
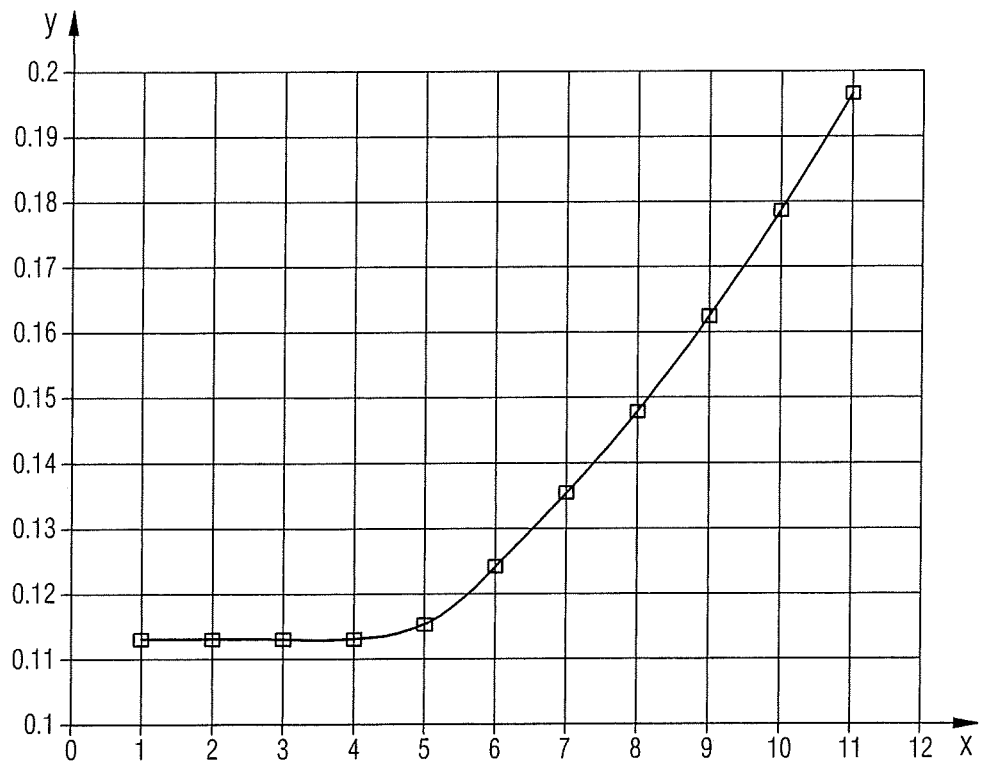
FIG. 16 shows a diagram of a change of the angle of the outer face of the ridges for the ridges.

FIG. 16 shows, for possible examples of the Fresnel optics, a variation of the outer angles of the outer faces of the ridges respectively for one ridge. In this example, the ridges are denoted along the x axis by position numbers 1 to 11, position number 1 showing the radially innermost ridge and position number 11 showing the radially outermost ridge. Furthermore, a variation of the outer angle of the outer face 41 of the corresponding ridge is indicated along the y axis. In this example, the variation is indicated not as an absolute value of the angle but as a function of a predetermined emission angle of the light-emitting diode. The outer angles of the outer faces may vary to differing degrees for the different ridges. For example, the ridges arranged first, second, third and fourth outward in the radial direction respectively have a variation of 0.115 times the emission angle of the light-emitting diode in one axis. Beyond the ridge with the fifth position number, the variation increases outward from ridge to ridge as seen in the radial direction. Improved desired imaging onto the target face, or the intended surface region 3, can therefore be achieved.

The outer faces of at least two ridges may have different angles in relation to the midaxis in a predetermined angle range in relation to the midaxis, a ridge lying further away from the midaxis in the radial direction comprising an outer face with a larger angle in relation to an outer face of a further ridge, the further ridge being arranged closer to the midaxis in the radial direction. Improved beam guiding is thereby achieved.

The outer face of at least one ridge may have different angles in relation to the midaxis in two predetermined angle ranges in relation to the midaxis. A further improvement of the beam guiding can thereby be achieved.

The outer faces of two sections of a ridge have equally large angles in relation to the midaxis in two angle ranges arranged mirror-symmetrically with respect to the midaxis. In this way, a symmetrical radiation distribution can be reinforced. The two angle ranges may, for example, cover 90°. The two angle ranges may also cover 180°.

The outer faces of two further sections of the ridge may have equally large angles with respect to the midaxis in two further angle ranges arranged mirror-symmetrically with respect to the midaxis. The two angle ranges may, for example, cover 90°.

Transition angle ranges may be provided between the angle ranges and the further angle ranges, the different angles of the outer faces of the sections of the one ridge merging into one another in the transition angle ranges. In this way, an improved light distribution is achieved.

Two sections of a ridge may be configured mirror-symmetrically with respect to the first or second principal axis in relation to the angles of the outer faces. In this way, symmetry is achieved in the illumination. In particular, the two sections of the ridge extend over 180°.

A ridge may be configured mirror-symmetrically in relation to the angles of the outer faces with respect to the first principal axis. Furthermore, the ridge is configured mirror-symmetrically in relation to the angles of the outer faces with respect to the second principal axis. In this way, symmetry is achieved in the illumination.

A plurality of ridges may be configured mirror-symmetrically with respect to the first principal axis and mirror-symmetrically with respect to the second principal axis in relation to the angles of the outer faces.

Figure 17:
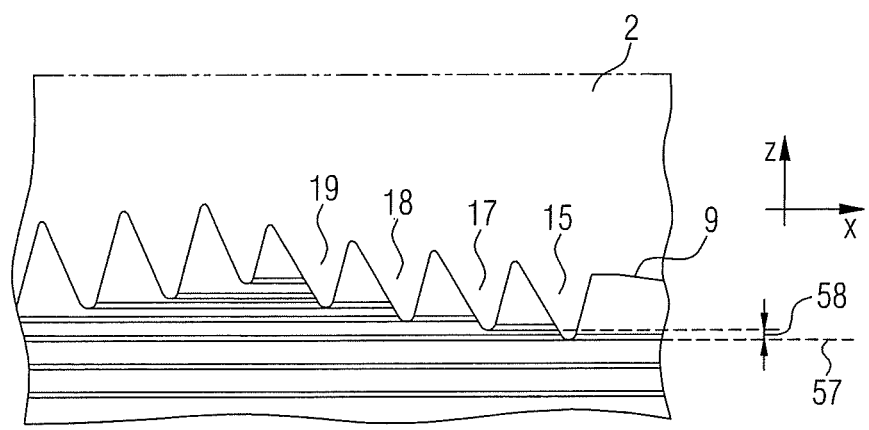
FIG. 17 shows a partial cross section through the Fresnel structure of FIG. 1.

FIG. 17 shows a partial cross section through the Fresnel structure 8 of the Fresnel optics 2. The ridges 15, 17, 18, 19 that may also be referred to as Fresnel apexes, comprise upper end faces 25. The upper end faces 25 may have different height positions in relation to an imaginary reference plane 57. The reference plane 57 may be established by the height position of the end face 25 of the first ridge 15. The end face 25 of the second ridge 17 has a first distance 58 in relation to the reference plane 57. The first distance 58 is further away from the light-emitting diode, and therefore regarded as a negative value.

Figure 18:
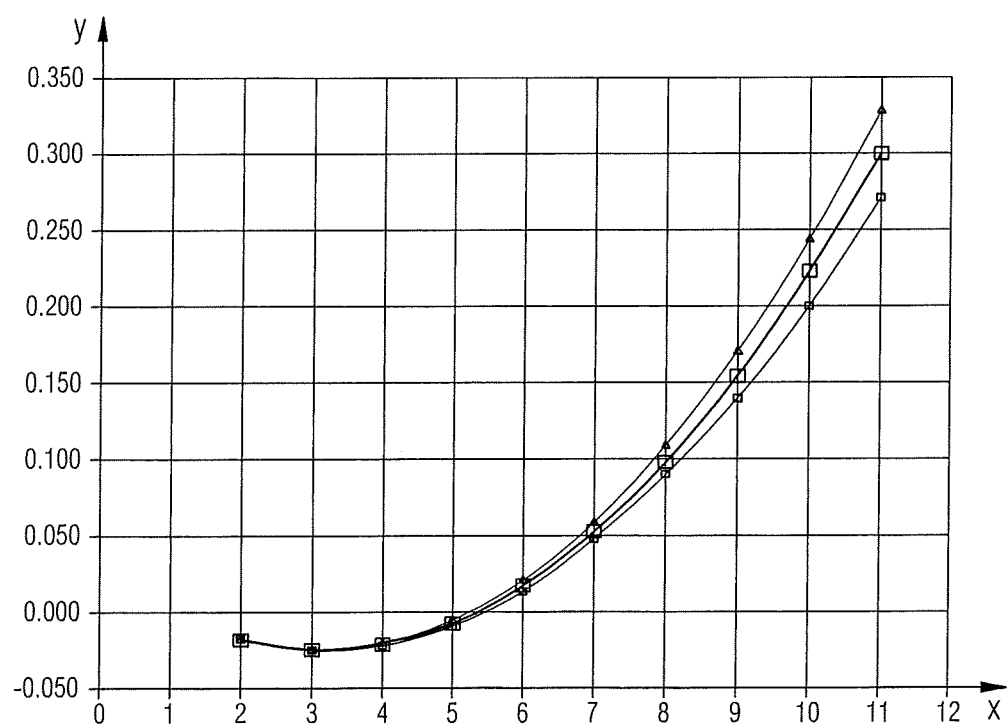
FIG. 18 shows a diagram with an indication of height differences of the end faces of the ridges of FIG. 17.

FIG. 18 shows a diagram with an indication of the relative distances of the end faces of the ridges in relation to the reference plane 57 according to the example of FIG. 17. The reference plane 57 is formed by the height position of the end face 25 of the first ridge 15. Along the x axis, the ridges are represented with an indication of the position numbers as seen in the radial direction from the inside outward. Since the first ridge 15 represents the reference plane, the first ridge 15, i.e., the position number 1, does not appear in the diagram. Along the y axis of the diagram, a width of a light-emitting diode is indicated as a unit. It can be seen that the ridges with the position numbers 2, 3, 4 and 5 have negative distance values and are therefore further away from the light-emitting diode 1 than the end face 25 of the first ridge 15. Beyond the ridge with the position number 6, the end faces 25 of the ridges are closer to the light-emitting diode than the end face 25 of the first ridge 15.

The height differences of the end faces of the ridges need not follow a linear relation as seen in the radial direction, but may, for example, follow a parabolic function with a local minimum. The height positions of the end faces of the ridges may, for example, be −0.05 times the width of the light-emitting diode to 0.4 times the width of the light-emitting diode. Furthermore, the height differences may be +−10% of the values indicated.

The end faces 25, in cross section perpendicular to the optical axis 10, have a rounding radius 61 which may of 0.01 mm to 0.03 mm. In addition, the outer angles of the outer faces of the ridges have values that, for horizontal outer angles, are 0.15 to 0.5 of the horizontal emission angle range of the light-emitting diode. In addition, diagonal outer angles 46 of the outer faces of the ridges may be 0.15 to 0.5 times the horizontal emission angle range of the light-emitting diode. Furthermore, the outer angles in the vertical direction may be 0.2 to 0.6 times the vertical emission angle range of the light-emitting diode.

Figure 19:
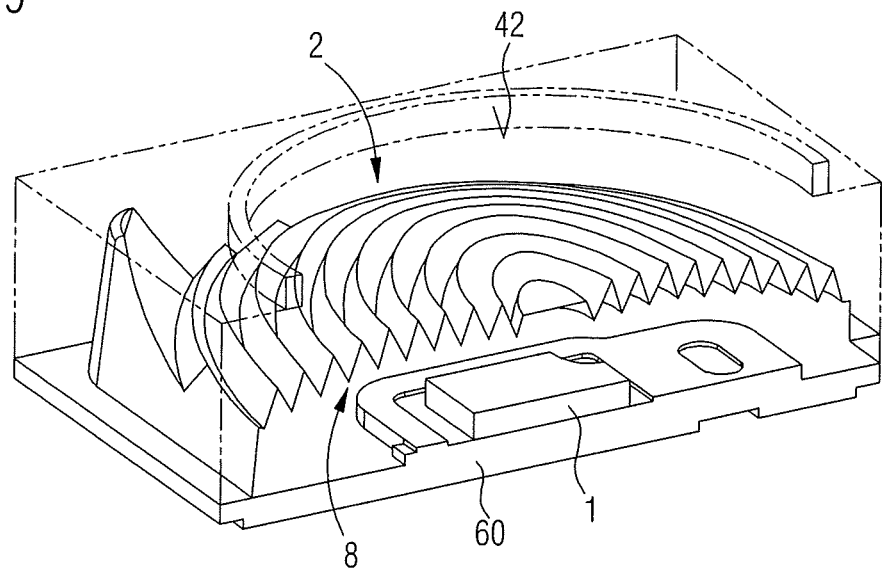
FIG. 19 shows a cross section through a device having a light-emitting diode and Fresnel optics.

FIG. 19 shows a device having a light-emitting diode 1 arranged on a carrier 60.

Furthermore, the Fresnel optics 2 are arranged on the carrier 60, the Fresnel structure 8 facing toward the light-emitting diode 1. The light-emitting diode 1 is configured, for example, as a semiconductor chip, in particular as an LED semiconductor chip. The second side 42 of the Fresnel optics 2 is configured as a planar face in the example represented. For better representation, the Fresnel optics 2 are represented transparently, the cross section extending through the middle of the arrangement.

Figure 20:
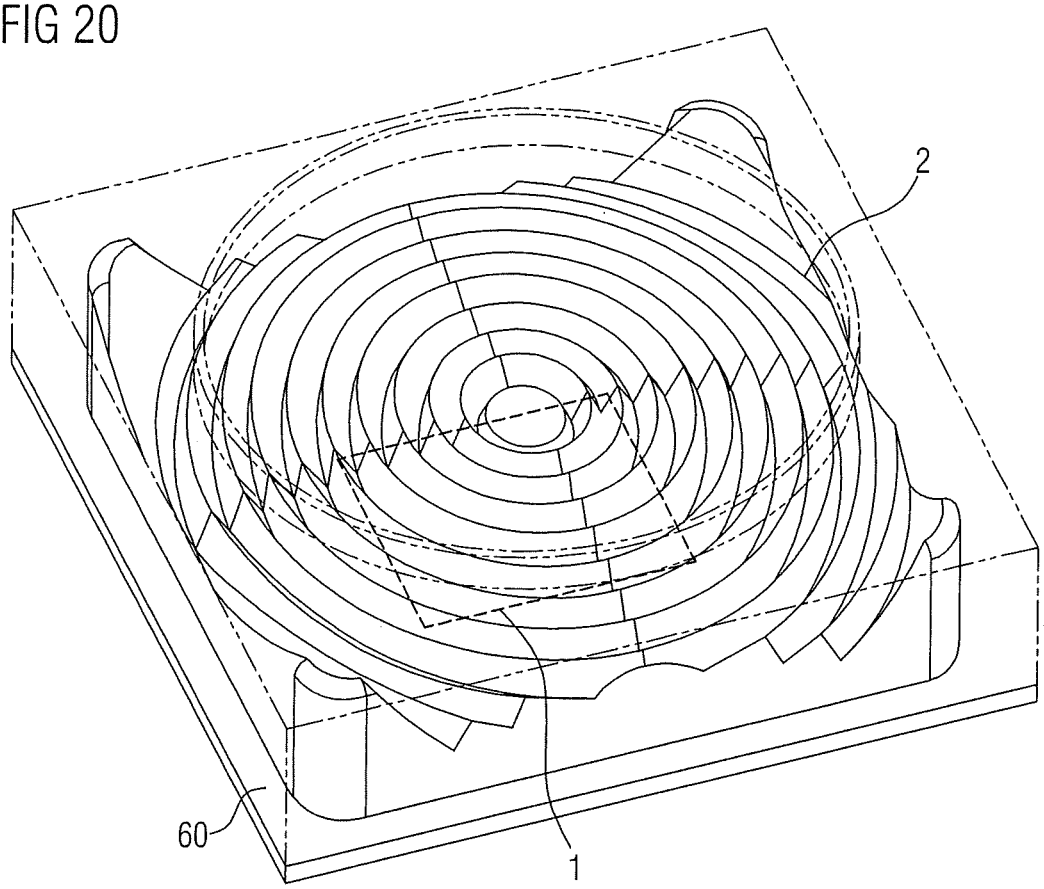
FIG. 20 shows a plan view of an emission side of the device of FIG. 19.

FIG. 20 shows a perspective overall view of the device of FIG. 19, the Fresnel optics 2 being represented transparently.

Figure 21:
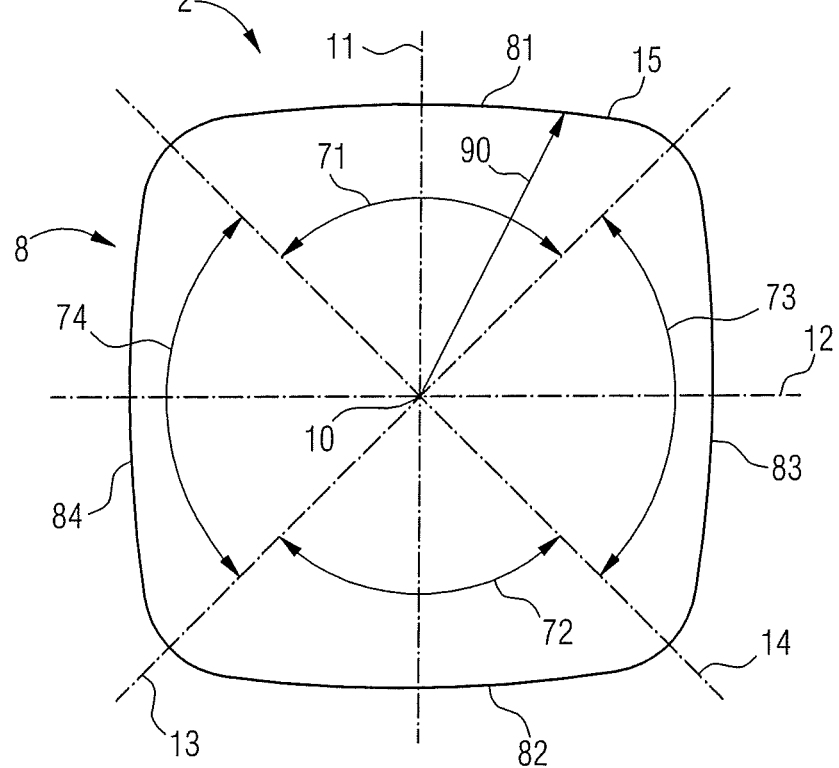
FIG. 21 shows a schematic representation of a detail of Fresnel optics.

FIG. 21 shows, in a schematic representation, a detail of a Fresnel structure 8 of Fresnel optics that may be configured according to one of the examples. In this representation, only one ridge 15 is represented. The other ridges and grooves are not represented. The first and second principal axes 11, 12 are mutually perpendicular and intersect in the optical midaxis 10 of the Fresnel structure 8. In addition, the first and second diagonal axes 13, 14 are represented. Furthermore, a first angle range 71 and a second angle range 72 are represented and arranged symmetrically with respect to the second principal axis 12. In addition, a third and a fourth angle range 73, 74 are represented and arranged symmetrically with respect to the first principal axis 11.

In the first angle range, the ridge 15 comprises a first section 81. In the second angle range 72, the ridge 15 comprises a second section 82. The first and second sections 81, 82 are configured mirror-symmetrically in relation to the second principal axis 12. Furthermore, a radius of curvature 90 is represented by way of example at one angular position. The radius of curvature 90 may vary for the ridge 15 as a function of the angular position, as represented.

In the third angle range 73, the ridge 15 comprises a third section 83, and in the fourth angle range 74 a fourth section 84. The third and fourth sections 83, 84 are arranged mirror-symmetrically with respect to the first principal axis 11. In the example, the angle ranges 71, 72, 73, 74 each have a size of 90°. The angle ranges 71, 72, 73, 74 may also be smaller than 90°. In this example, transition angle ranges may then be provided between the angle ranges.

In a further example, individual angle ranges may also be larger than 90° and other angle ranges may also be smaller than 90°.

The other ridges of the Fresnel structure 8 not represented in the figure may, in relation to the angle ranges 71, 72, 73, 74, have a similar symmetry in relation to the first and second midaxes 11, 12 as the ridge 15 represented and described.

Figure 22:
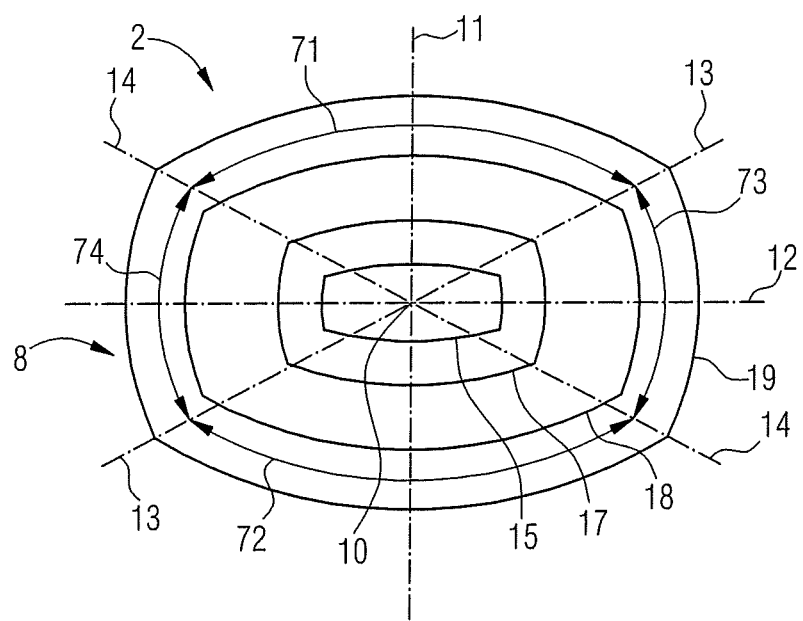
FIG. 22 shows a schematic representation of Fresnel optics.

FIG. 22 shows a schematic representation of corresponding Fresnel optics 2, the ridges 15, 17, 18, 19 being arranged symmetrically with respect to the first and second principal axes in the respective angle ranges 71, 72, 73, 74.

The symmetry may relate to the radial distances of the ridges from the optical midaxis 10 and/or to the radii of curvature of the ridges and/or to the angles of the outer faces of the ridges in relation to the optical midaxis.

A ridge may have an equally large first radius of curvature in the first and third angle ranges 71, 73. Furthermore, a ridge may have an equally large second radius of curvature in the second and fourth angle ranges. The first radius of curvature is greater than the second radius of curvature. Furthermore, the radii of curvature merge into one another either continuously or abruptly at an angle at the boundaries of the angle ranges.

The light-emitting diode 1, particularly in an LED chip, may have a distance from the Fresnel structure along the optical axis 10 that is 0.2 times the width of the LED chip to 0.8 times the width of the LED chip. In particular, the distance between the LED chip and the Fresnel structure may be 0.5 times the width of the LED chip.

Figure 23:
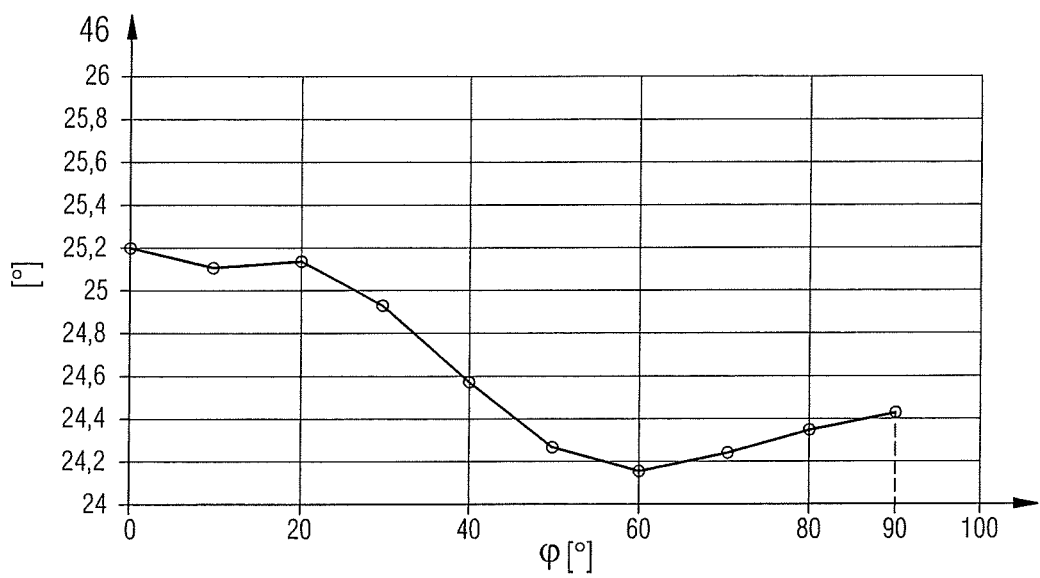
FIG. 23 shows a polar variation of the outer angle of a ridge.

FIG. 23 shows in a diagram the size of the outer angle 46 of the outer face 41 of a ridge, for example, of the first ridge 15 as a function of a polar angle $\Phi$ about the midaxis 10 of the Fresnel structure. The outer angle 46 of the outer face 41 of the ridge starts with a value of 25.2° in relation to the optical axis 10 at a polar angle $\Phi$ of 0°. The polar angle $\Phi$ is plotted counterclockwise starting from the first principal axis 11, as can be seen with the aid of the schematic FIG. 24. In a similar way, a plurality of ridges or each ridge of the Fresnel structure may have a variation of the outer angle 46 of the outer face 41 along the polar angle.

Figure 24:
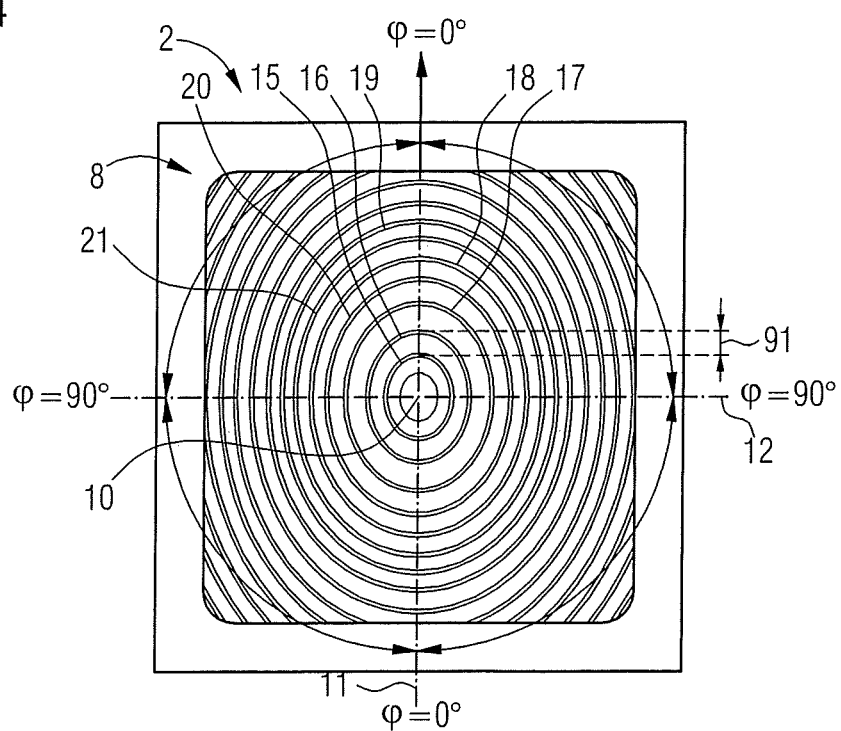
FIG. 24 shows a schematic representation of Fresnel optics.

FIG. 24 shows a schematic representation of Fresnel optics 2 having a Fresnel structure 8 with ridges 15, 17, 18, 19 and grooves 16, 20, 21, 22 that may be configured according to the examples described above. The optical axis 10 is arranged in the middle of the Fresnel structure 8. The first and second principal axes 11, 12 that are mutually perpendicular and perpendicular to the optical axis 10 that forms the midaxis, intersect in the optical axis 10.

The polar angle $\Phi$ starts at 0° at the first principal axis 11. As represented in FIG. 23, the size of the outer angle 46 of the outer face 41 of the ridge decreases counterclockwise starting from the polar angle of 0° until a polar angle of about 10° to a value of about 25.1°, and subsequently increases again in the direction of the polar angle of 20°. Beyond a polar angle of 20°, the outer angle 46 decreases until a polar angle of 60° to a value of somewhat less than 24.2°. For polar angles which are greater than 60°, the outer angle 46 increases again to a value of somewhat more than 24.4° at a polar angle of 90°. The outer angle 46 of the outer face 41 of the ridge decreases clockwise in the same way starting from a polar angle of 0°, i.e., starting from the first principal axis 11, until about 10° of the polar angle to a value of about 25.1°, and subsequently increases somewhat again in the direction of the polar angle of 20°. Beyond a polar angle of 20°, the outer angle 46 decreases until a polar angle of 60° to a value of somewhat less than 24.2°. After the polar angle of 60°, the outer angle 46 increases again to a value of somewhat more than 24.4° at a polar angle of 90°. The outer angle 46 of the outer face 41 of the ridge therefore has a mirror-symmetrical profile with respect to the first principal axis 11.

Furthermore, the outer angle 46 of the outer face 41 of the ridge has a mirror-symmetrical configuration in relation to the second principal axis 12. The outer angle 46 of the outer face 41 therefore decreases starting from the second principal axis 12 counterclockwise from the value 24.4° to a value of 24.2°, and then increases again to the value of 25.2° in the region of the first principal axis 11.

Each ridge of the Fresnel structure 8 may, for example, have the variation of the outer angle 46 of the outer face 41 of the ridge with the polar angle $\Phi$ represented in the diagram of FIG. 23. In this example, the outer angles 46 of the outer faces 41 of the various ridges may vary from one another according to the ranges explained above.

In this example, the outer face of a ridge has an angle, i.e., an outer angle, in relation to the optical midaxis having a maximum value in the region of the first principal axis 11. The outer angle decreases with the polar angle in the direction of the second principal axis 12. In this example, the outer angle may increase again after a predetermined polar angle of, for example, 60° is exceeded. A plurality of ridges may comprise a corresponding outer face with a corresponding outer angle. Furthermore, the outer angles of the outer faces of the ridges may vary from one another. The outer angles of the outer faces of at least one ridge or of a plurality of ridges are configured mirror-symmetrically with respect to the first principal axis 11 and/or with respect to the second principal axis 12.

FIG. 25 shows in a diagram a variation of the ridge distance 91 between the two adjacent first and second ridges 15, 17, plotted against the polar angle $\Phi$. The ridge distance 91 between two ridges is measured along a straight line through the optical midaxis 10, the ridge distance 91 being measured between the upper ends of the ridges 15, 17. The profile of the polar angle $\Phi$ is configured as explained with the aid of FIG. 24. In the diagram of FIG. 25, the ridge distance 91 between two adjacent ridges 15, 17, for example, between a first inner ridge 15 and the second adjacent ridge 17 arranged further outward is represented. The ridge distance 91 starts with a polar angle $\Phi$ of 0° at the first principal axis 11 with a value of somewhat less than 0.2 mm. With the aid of the characteristic curve represented in the diagram, it can be seen that the ridge distance 91 decreases as a function of the polar angle Φ counterclockwise in an established characteristic curve until the polar angle of 80° to a minimum value of 0.1775 mm, and subsequently increases again somewhat in the direction of the polar angle of 90°. The ridge distance 91 between the two ridges is configured mirror-symmetrically with respect to the first principal axis 11 and, therefore, also has the values represented in the diagram for the profile of the polar angle Φ starting from the first principal axis in the clockwise sense. Furthermore, the ridge distance of the two ridges is configured mirror-symmetrically with respect to the second principal axis 12.

The variation, represented in the diagram of FIG. 24, of the ridge distance 91 between two adjacent ridges may also be configured differently or identically for a plurality of adjacent ridges. In this example, the distances of two adjacent ridges may be configured differently according to the variations explained above.

Furthermore, the ridge distances 91 between at least two ridges or a plurality of adjacent ridges may have mirror symmetry with respect to one principal axis or in relation to both principal axes.

My devices have been illustrated and described in detail with the aid of preferred examples. This disclosure is not, however, restricted to the examples. Rather, other variants may be derived therefrom by those skilled in the art without departing from the scope of protection of the appended claims.

This application claims priority of DE 10 2016 123 002.2, the subject matter of which is incorporated herein by reference.

The invention claimed is:

1. A device that illuminates a predetermined surface region comprising a radiation-emitting optoelectronic component and Fresnel optics comprising a Fresnel structure having annular ridges and annular grooves, wherein the ridges are configured as closed rings, the ridges and the grooves enclose an optical midaxis of the Fresnel structure, at least one first section of a ridge has a different shape in a predetermined angle range in relation to the midaxis than a second section of the ridge in a second angle range, and the ridges of the Fresnel structure comprise an inner face and an outer face in cross section through a plane of the midaxis, the inner face facing toward the midaxis in the radial direction, the outer face facing away from the midaxis in the radial direction, the outer face of at least one ridge having different angles in relation to the midaxis in two predetermined angle ranges in relation to the midaxis.

2. The device as claimed in claim 1, wherein the two sections of the ridge in relation to the midaxis have at least two different radial distances from the midaxis and/or different radii of curvature.

3. The device as claimed in claim 2, wherein at least two sections of at least one second ridge have different radial distances from the midaxis and/or different radii of curvature in at least two angle ranges in relation to the midaxis.

4. The device as claimed in claim 3, wherein the first and second ridges constitute adjacent ridges in the radial direction, the two ridges being separated by a groove.

5. The device as claimed in claim 2, wherein at least two sections of at least one ridge are arranged mirror-symmetrically with respect to a principal axis through the midaxis in at least two angle ranges, the principal axis being perpendicular to the midaxis.

6. The device as claimed in claim 5, wherein at least two sections of the at least one ridge are arranged mirror-symmetrically with respect to a second principal axis through the midaxis in at least two angle ranges, the second principal axis being perpendicular to the first principal axis and perpendicular to the midaxis.

7. The device as claimed in claim 2, wherein transition angle ranges are provided between the angle ranges and the further angle ranges, the different radial distances and radii of curvature of the sections of the one ridge merging into one another or merging continuously into one another, in the transition angle ranges.

8. The device as claimed in claim 1, wherein the ridges of the Fresnel structure comprise an inner face and an outer face in cross section through a plane of the midaxis, the inner face facing toward the midaxis in the radial direction, the outer face facing away from the midaxis in the radial direction, the outer faces of at least two ridges having different angles in relation to the midaxis in a predetermined angle range in relation to the midaxis, a ridge lying further away from the midaxis in the radial direction comprising an outer face with a larger angle in relation to the midaxis compared to an outer face of a further ridge, the further ridge being arranged closer to the midaxis in the radial direction.

9. The device as claimed in claim 1, wherein the outer faces of two sections of a ridge have different angles with respect to the midaxis in at least two angle ranges in relation to the midaxis.

10. The device as claimed in claim 1, wherein the outer faces of at least two sections of a ridge are arranged mirror-symmetrically with respect to a first principal axis through the midaxis in two angle ranges, the first principal axis extending perpendicularly through the midaxis.

11. The device as claimed in claim 10, wherein the outer faces of at least two sections of the ridge are arranged mirror-symmetrically with respect to a second principal axis through the midaxis in two angle ranges, the second principal axis extending perpendicularly through the midaxis and perpendicularly through the first principal axis.

12. The device as claimed in claim 1, wherein transition angle ranges are provided between the angle ranges and the further angle ranges, the different angles of the outer faces of the sections of the one ridge merging into one another or merging continuously into one another, in the transition angle ranges.

13. The device as claimed in claim 1, wherein the ridges comprise end faces, the end faces of the ridges having a height position relative to a reference plane, the reference plane being arranged perpendicularly to the midaxis, at least the end faces of two ridges having different height positions relative to the reference plane.

14. The device as claimed in claim 13, wherein height differences of the end faces of the ridges follow a parabolic function with a local minimum starting with a first innermost ridge as far as a predetermined number of outer ridges.

15. The device as claimed in claim 1, wherein the ridges comprise end faces, the end faces of the ridges having rounding radii in a cross section through the midaxis, at least the rounding radii of end faces of two ridges being different.

16. The device as claimed in claim 1, wherein at least one ridge or at least two ridges are arranged neither circularly nor elliptically around the midaxis.

17. The device as claimed in claim 1, wherein the angle of the outer face of at least one ridge has a maximum value in the region of the first principal axis or the angle of the outer face of the ridge decreases along a polar angle in the direction of the second principal axis at least in a predetermined polar angle range about the midaxis of the Fresnel structure and subsequently increases again as far as the second principal axis.

18. The device as claimed in claim 1, wherein at least two adjacent ridges have a radial distance from one another, a value of which varies at least in sections with a polar angle about the midaxis of the Fresnel structure.

19. The device as claimed in claim 18, wherein the radial distance of the two ridges has a maximum value in the region of a first principal axis of the Fresnel structure, the radial distance of the ridges decreasing along a polar angle about the midaxis of the Fresnel structure in the direction of the second principal axis at least in one angle range, the radial distance in particular increasing again in the direction of the second principal axis after a predetermined polar angle is exceeded.

* * * * *